United States Patent [19]

Heid

[11] Patent Number: 5,777,472
[45] Date of Patent: Jul. 7, 1998

[54] RECONSTRUCTION OF IMAGES FROM MR SIGNALS OBTAINED IN THE PRESENCE OF NON-UNIFORM FIELDS

[75] Inventor: Oliver Heid, Bern, Switzerland

[73] Assignee: Siemens Aktiengesellschaft, Munich, Germany

[21] Appl. No.: 499,036

[22] Filed: Jul. 6, 1995

[30] Foreign Application Priority Data

Jul. 6, 1994 [DE] Germany ................ 442 38 06.1

[51] Int. Cl.$^6$ ........................... G01V 3/00
[52] U.S. Cl. ........................ 324/309; 324/307
[58] Field of Search .................. 324/309, 307, 324/312, 314, 300, 318; 128/653.2, 653.5

[56] References Cited

U.S. PATENT DOCUMENTS

| | | | |
|---|---|---|---|
| 4,706,025 | 11/1987 | Edelstein et al. | 324/309 |
| 5,212,448 | 5/1993 | Le Roux et al. | 324/309 |
| 5,363,036 | 11/1994 | Mansfield | 324/309 |
| 5,432,448 | 7/1995 | Heid et al. | 324/309 |
| 5,545,991 | 8/1996 | Naverth | 324/307 |

FOREIGN PATENT DOCUMENTS

| | | |
|---|---|---|
| PS 42 19 610 | 1/1994 | Germany . |
| OS 42 32 731 | 4/1994 | Germany . |
| 43 34 038 | 3/1995 | Germany . |

OTHER PUBLICATIONS

"SPI–Single Point FID Imaging MRI With Echo Times < 50 µs," Nauerth et al., SMRM Abstracts, 1993, p. 1215 (month of pub. unknown).

"NMR für Mediziner und Biologen," Hausser et al (1989), pp. 153–158.

*Primary Examiner*—Louis M. Arana
*Attorney, Agent, or Firm*—Hill & Simpson

[57] ABSTRACT

For MR image acquisition, a sequence of individual measurements that are each composed of an excitation phase and a read-out phase is implemented. In the read-out phase, a nuclear magnetic resonance signal is read out that is allocated to only one point in the k-space defined by a preceding phase-coding gradient. A phase-coding gradient remains activated during a group of individual measurements and changes in size from individual measurement-to-individual measurement. Switching this phase-coding gradient in every individual measurement is thus avoided, so that ramp times can be eliminated and the overall data acquisition procedure is considerably shortened.

10 Claims, 5 Drawing Sheets

RECONSTRUCTION OF IMAGES FROM MR SIGNALS OBTAINED IN THE PRESENCE OF NON-UNIFORM FIELDS

BACKGROUND OF THE INVENTION

1. Field of the Invention

The present invention is directed to a method for reconstructing an image of an examination subject from MR (magnetic resonance) signals which are acquired in the presence of non-uniform fields.

2. Description of the Prior Art

Magnetic resonance image acquisition with a sequence of individual measurements, each composed of an excitation phase in which nuclear spins are excited with excitation pulses, a coding phase wherein the nuclear spins are phase-coded with at least one phase-coding gradient, a read-out phase wherein a nuclear magnetic resonance signal is read out, the magnetic resonance signal being allocated by the preceding phase-coding gradient to a specific point in the k-space. Each signal acquired in the read-out phase is entered into a k-space matrix, with the measuring sequence being implemented n times with respectively different phase coding for the complete scan of the k-space.

A method of this type is disclosed, for example, in German OS 42 19 610 and German OS 42 32 731.

As is known, inhomogeneities in the basic magnetic field lead to image distortions in standard MR imaging sequences. Pulse sequences currently employed are generally based on the so-called "spin-warp" method, as disclosed, for example, in U.S. Pat. No. 4,706,025. A nuclear magnetic resonance signal is thereby phase-coded in at least one direction before the read-out and is frequency-coded in another direction by a read-out gradient during the read-out. Inhomogeneities of the basic magnetic field in the phase-coding direction are relatively unimportant since the only concern is the signal differences between the individual phase-coding steps. The superimposition of the readout gradient with basic field inhomogeneities, however, leads to distortions in the direction of the read-out gradient. In conventional methods having slice selection during the radio-frequency excitation phase, further distortions arise since the field inhomogeneities act as a locus-dependent, additional slice selection gradient. This leads to bendings of the slice surface as well as a varying slice thickness.

Only linearity deviations of no more than approximately 1 ppm can therefore typically be tolerated within the measuring volume for magnets used for nuclear magnetic resonance tomography apparatus.

These demands can only be met with substantial outlay. In particular, magnets must be constructed comparatively long, or with a comparatively large area (given pole shoe magnets), in relationship to the actual measuring volume so that the required uniformity can be achieved.

For nuclear magnetic resonance tomography in solids having an extremely short echo time, for example, the article "SPI—Single Point FID Imaging, MRI With Echo Times <50 µs" A. Nauert et al., SMRM Abstracts, 1993, p.1215, discloses that only one phase coding be implemented after an excitation and that a FID signal be acquired very quickly after the excitation without influence of a read-out gradient. By contrast to the standard spin-warp method, only one point in the k-space is thereby obtained with each signal. In order to produce an image having 128×128 picture elements, thus, 128×128 individual measurements are required, each having radio-frequency excitation and phase coding. When, due to the aforementioned problem of selected excitation, a 3-dimensional phase coding is implemented instead then, for example, 128×128×128=2,097,152 individual measurements are required. Since the gradient fields must be activated and in turn deactivated for each individual measurement, a long measuring time arises, particularly particularly due to the required ramp times for the gradient pulses. Such a measurement is also extremely inefficient.

SUMMARY OF THE INVENTION

It is therefore an object of the present invention to provide a method for MR image acquisition wherein the time expended for the image acquisition becomes shorter than in known methods.

This object is inventively achieved in a method for MR image reconstruction wherein a first phase-coding gradient remains activated during a group of chronologically contiguous individual measurements, and the first phase-coding gradient changes in size from individual measurement-to-individual measurement. Since the activation and deactivation of the phase-coding gradients in each individual measurement is thereby not necessary, the ramp times that are otherwise needed for the activation and deactivation of the phase-coding gradient are eliminated and the image acquisition can be implemented significantly faster.

DESCRIPTION OF THE PREFERRED EMBODIMENTS

The conventional spin-warp sequence of FIGS. 1–6 is merely intended to serve the purpose of explaining the problem which is solved by the inventive method. In the illustrated example, a frequency-selective radio-frequency pulse RF is first emitted under the influence of a slice selection gradient $G_S$. Nuclear spins are thus excited only in one slice of the examination subject. Subsequently, the dephasing caused by the positive sub-pulse of the slice selection gradient $G_S$ is in turn canceled by a negative sub-pulse $G_S^-$. Further, a phase-coding gradient $G_P$ is emitted. Finally, a negative read-out gradient $G_R^-$ is also activated.

Only a positive read-out gradient $G_R^+$ is activated during the following read-out phase. The arising echo signal S—as indicated by arrows on the axis AQ—is sampled M times and the M measured values acquired in this way are entered into a row of a raw data matrix RD according to FIG. 7.

The illustrated pulse sequence is repeated N times with different values of the phase-coding gradient $G_P$, so that a measured matrix having N rows is obtained overall. Usually, the phase-coding gradient is thereby advanced from the highest positive to the highest negative value, or vice versa, in identical steps from pulse sequence-to-pulse sequence. The raw data matrix RD can be considered to be a measured data space, i.e., a measured data plane in the 2-dimensional case in the exemplary embodiment. This measured data space is referred to as "k-space" in nuclear magnetic resonance tomography.

The information about the spatial origin of signal contributions necessary for the imaging is coded in the phase factors, whereby the relationship between the locus space having the Cartesian coordinates x, y, z and the k-space exists mathematically via a Fourier transformation $$S(k_x, k_y) = \int \int \rho(x,y) e^{i(k_x x + k_y y)} dx dy$$

$$k_x(t) = \gamma \int_0^t G_R(t') dt'$$

$$k_y(t) = \gamma \int_0^t G_P(t') dt'$$

The following definitions thereby apply:
γ=gyromagnetic ratio
$G_R(t')$=momentary value of the read-out gradient (in the x-direction)
$G_P(T')$=momentary value of the phase-coding gradient (in the y-direction)
ρ(xy)=nuclear spin density.

Figure 1:
FIGS. 1–6 illustrate a conventional spin-warp sequence for explaining the problem solved by the inventive method.
Figure 2:
Figure 3:
Figure 4:
Figure 5:
Figure 6:
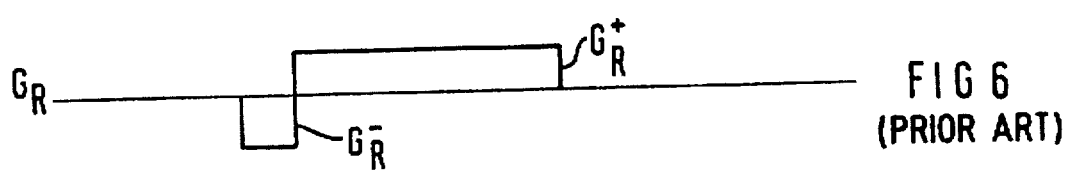
Figure 7:
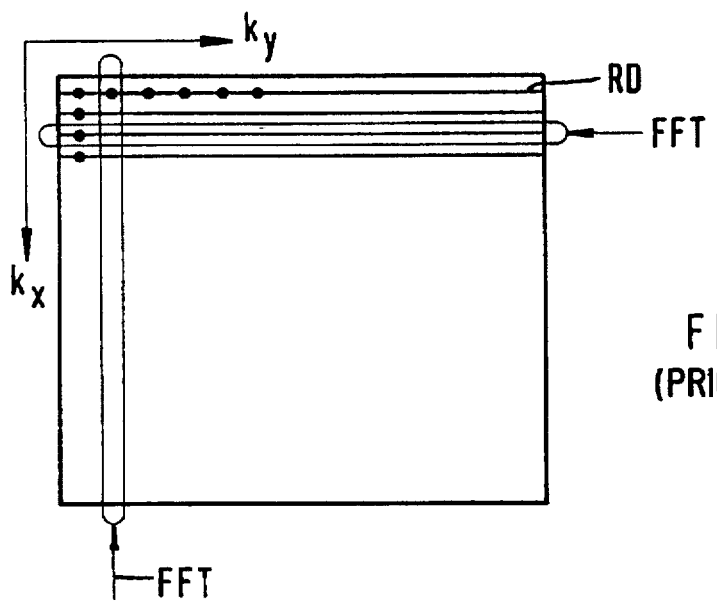
FIG. 7 illustrates a k-space matrix, also for explaining the problem.

In the raw data matrix RD shown in FIG. 7, each line corresponds to an individual nuclear magnetic resonance signal. Given a step-by-step advance of the phase-coding gradient $G_P$, the scanning in the k-space ensues in successive rows. A phase-coding gradient $G_P$ whose gradient amplitude increases continuously in steps from subsequence-to-sub-sequence is activated before the nuclear magnetic resonance signal S at the beginning of every individual measurement. When, for example, each nuclear magnetic resonance signal is sampled with 128 measuring points and when 128 phase-coding steps are implemented, then a raw data matrix having 128 rows and 128 columns is obtained, i.e., 128×128 measured values in the k-space. The analog measured signals obtained given the pulse sequence of FIGS. 1–6 are thus digitized onto a grid in the k-space.

Figure 8:
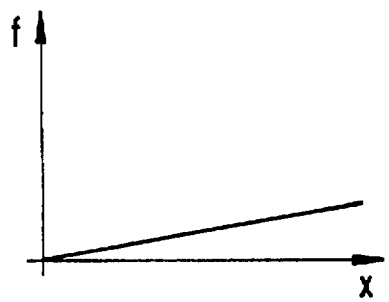
FIGS. 8 and 9 are respectively ideal and actual diagrams showing the relationship of location in the phase-coding direction versus the allocated resonant frequency for explaining the effect of magnetic field inhomogeneities.
Figure 9:
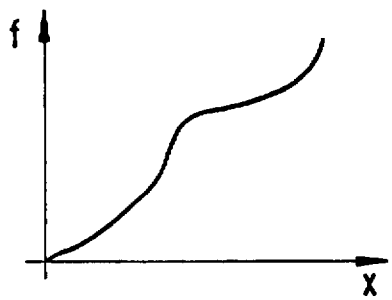
Figure 10:
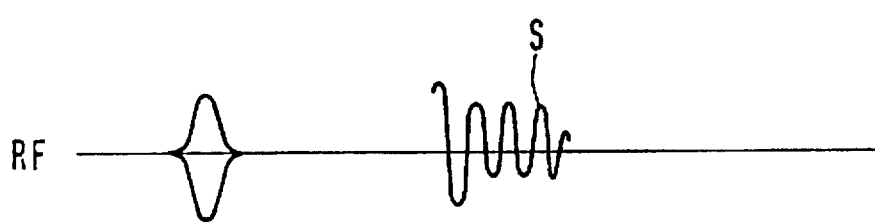
FIGS. 10–14 illustrate a conventional SPI sequence, also for explaining the problem.
Figure 11:
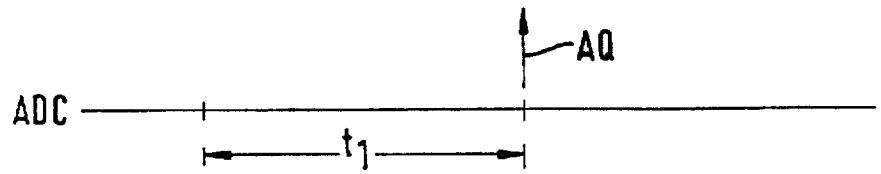
Figure 12:
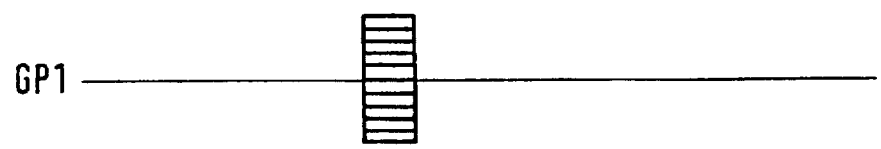
Figure 13:
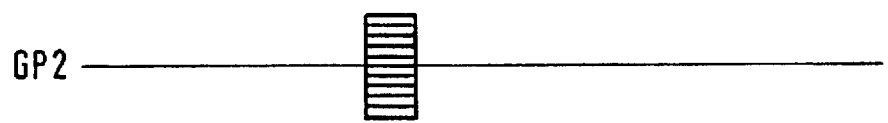
Figure 14:
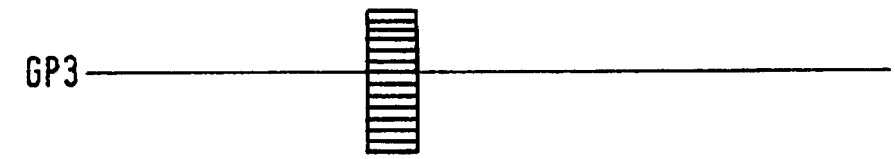

An image matrix is then acquired by 2-dimensional Fourier transformation from the raw data matrix, or k-space matrix, RD. As previously mentioned, two types of distortion occur in a non-uniform basic magnetic field:

Magnetic field inhomogeneities during the excitation phase lead to bendings of the slice surface and to a varying slice thickness. In the read-out phase, magnetic field inhomogeneities lead to distortions in the direction of the read-out gradient $G_R$. In the ideal case, the linear relationship between the location x in frequency-coding direction and the allocated resonant frequency f of the nuclear spins should be achieved as a result of the read-out gradient $G_R$ as shown in FIG. 8. Magnetic field inhomogeneities, however, lead to non-linearities in this context, as shown in FIG. 9. This occurs because gradients that represent the inhomogeneities of the basic magnetic field are superimposed on the linear read-out gradient $G_R$.

With the condition that the magnetic field is constant during the read-out phase, inhomogeneities in phase-coding direction do not lead to distortions since the principal concern is the signal differences between successive phase-coding steps.

In what is referred to as a SPI sequence (single point imaging), a read-out gradient is foregone and phase-coding gradients are applied. Such a sequence known from the previously cited article of Nauerth et al. is shown in FIGS. 10–14, likewise for explaining the problem. A non-selective radio-frequency pulse RF is thereby followed by a phase-coding of the nuclear magnetic resonance signal in three directions as a result of the three phase-coding gradients GP1, GP2 and GP3 residing perpendicularly relative to one another. The arising FID (free induction decay) signal is read out a fixed time T1 after the excitation. Whereas a complete row in the k-space matrix is always acquired with each signal in the above-described, conventional spin-warp method, only a point in the k-space is obtained in the method illustrated in FIGS. 10–14, this being defined by the gradients GP1–GP3. A corresponding number of individual measurements is therefore required for acquiring a data set having 128×128×128 k-space points, with all required k-space points being covered successively by appropriate switching of the gradients GP1–GP3.

In order to keep the time expenditure within reasonable limits, an attempt must be made to make the repetition time of the individual measurements as short as possible. The three gradients GP1–GP3, however, must be respectively switched on and off in each individual measurement. Since gradient coils have an inductance which is not inconsiderable, the switching events cannot ensue arbitrarily quickly; on the contrary, substantial ramp times that oppose a shortening of the repetition time are required for the activation and deactivation. One thus arrives at a overall measuring time that cannot be accepted for practical operation.

Substantially shorter measuring times can be achieved when, according to an exemplary embodiment of the invention in FIGS. 15–18, the phase-coding gradients are not switched on and off in every individual measurement but are left switched on at least for a group of individual measurements.

Figure 15:
FIGS. 15–18 illustrate an exemplary embodiment of the method of the invention.
Figure 16:
Figure 17:

FIG. 15 shows a sequence of radio-frequency pulses RF between which the data acquisition phases respectively referenced AQ lie. The phase-coding gradients GP2 and GP3 according to FIGS. 17 and 18 remain constant during the illustrated group of individual measurements, whereas the phase-coding gradient GP1 changes linearly from a negative to a positive value. One thus obtains N nuclear magnetic resonance signals that are all differently phase-coded in the direction of the phase-coding gradient GP1. A complete row of the k-space matrix will thus typically be acquired.

For acquiring the further rows of a k-space matrix having a total of M rows, the illustrated measurement is repeated M times with different values of the phase-coding gradient GP2. Correspondingly, the entire procedure is repeated P times with different values of the phase-coding gradient GP3 for acquiring the third direction, so that a total of M·P measurements according to FIGS. 15–18 are required in order to cover a 3-dimensional k-space.

The advantage of the described pulse sequences is that the ramps for the gradient pulses during the individual measurements are eliminated, so that the individual measurements can be repeated significantly faster.

The radio-frequency pulses are implemented as "hard" pulses, i.e. broadband pulses, so that the simultaneously activated gradients do not undesirably lead to a slice selection. Although the gradient GP1 is activated during every read-out phase, this does not lead to distortions as in the case of conventional data acquisition since only an individual measured point having a fixed spacing relative to the radio-frequency pulse RF is registered in each measurement, instead of the entire signal being read out with the frequency-dependency caused by a read-out gradient.

Figure 18:
Figure 19:
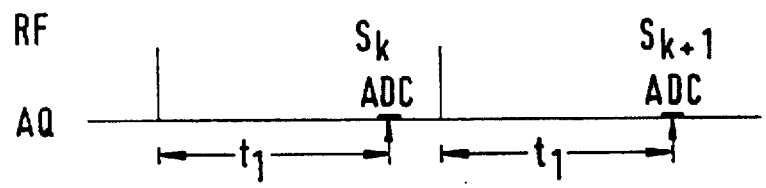
FIGS. 19–21 illustrate two individual measurements in detail.
Figure 20:
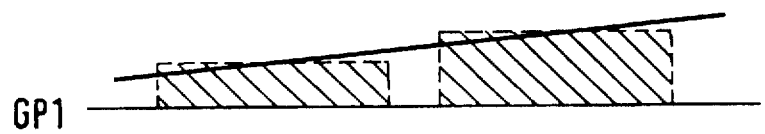
Figure 21:
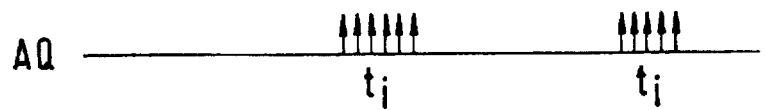

For illustration, a part of the sequence of FIGS. 15 and 18 is shown with an expanded time scale in FIGS. 19 and 20. One may thereby see that each signal $S_k$ is read out at a fixed time interval $t_1$ following the appertaining excitation pulse $RF_k$. The phase-coding in the direction of the phase-coding gradient GP1 is defined by the time integral thereof between excitation and read-out time, i.e. over the time span $t_1$. This time integral is shown shaded in FIG. 20. One may thereby see that the phase coding increases in the direction of the phase-coding gradient $G_{P1}$ from individual measurement to-individual measurement.

Measuring times on the order of magnitude of conventional methods are obtained with the described method. For example, a measuring time of 15 minutes was capable of being achieved for 64×128×128 measuring points. Given a time interval of 500 μs between excitation and read-out and a gradient system for a maximum of 10 mT/m·s, the field inhomogeneity over a 300 mm subject expanse that could be tolerated without perceptible image artifacts amounted to approximately 1% of the main field of 0.3 T. Radio-frequency excitation pulses having a duration of 10 μs and an excitation angle of 4° were thereby employed. The sampling rate for the nuclear magnetic resonance signals amounted to 200 kHz. A linear resolution of 2.53 mm for one voxel was achieved.

Figure 22:
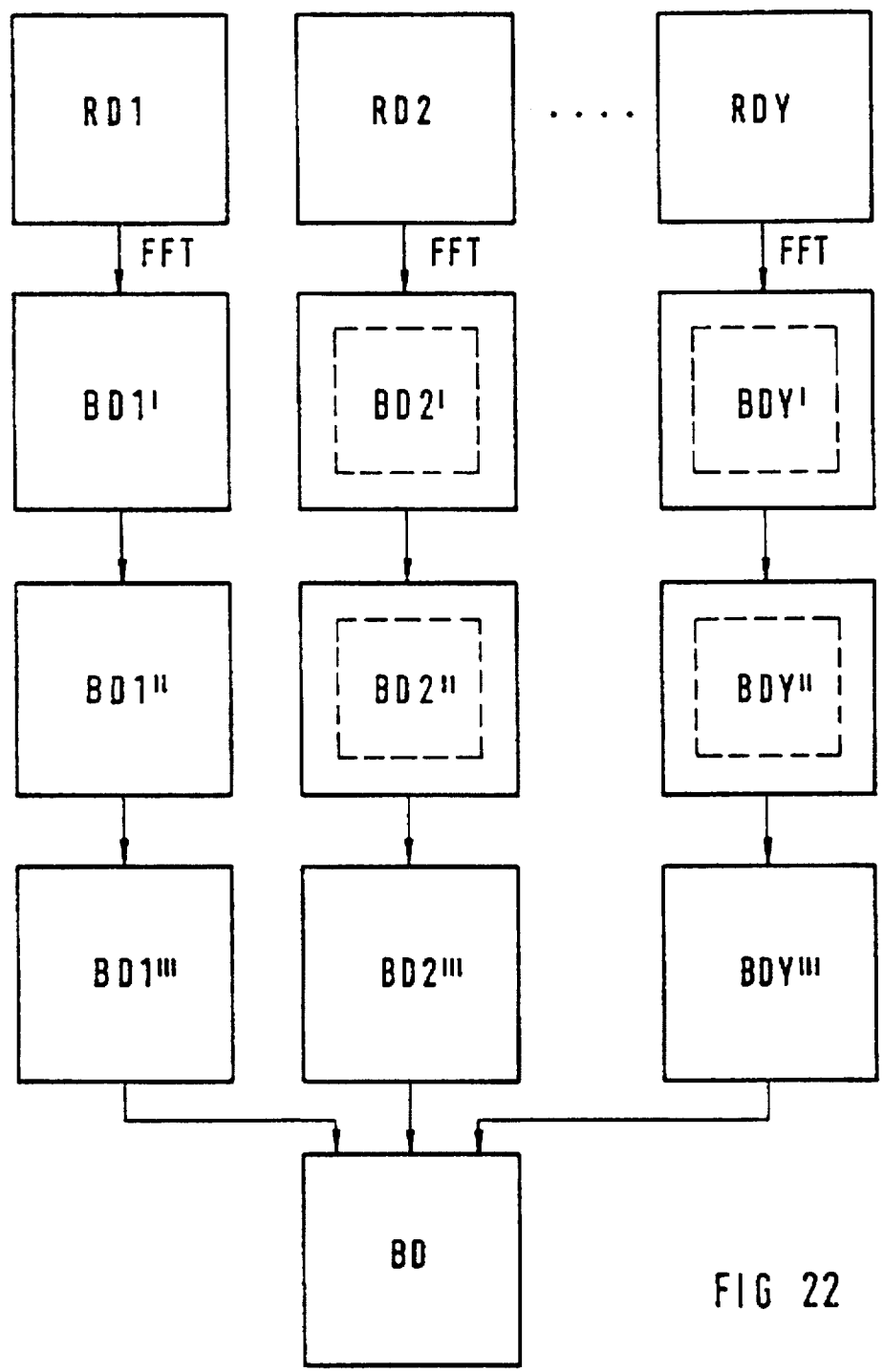
FIG. 22 is a block diagram for explaining an averaging of a number of image data sets.

Since only one data point is sampled from the nuclear magnetic resonance signal in the inventive method as described above, the signal-to-noise ratio is rather unfavorable with respect to the overall measuring time. In a further embodiment of the inventive method, the resulting nuclear magnetic resonance signal is thereby multiply sampled in every individual measurement, i.e. at y different time intervals $t_i$ after the excitation, as illustrated by the arrows in FIG. 22. Subsequently, a complete, separate k-space matrix is produced for each sampling time; i.e., a total of y k-space matrices RD1-RDy are obtained. The further processing is shown in the block diagram of FIG. 22. Each k-space matrix RD1-RDy is separately subjected to a FFT (fast Fourier transform) transformation. A corresponding number of the image matrices BD1'-BDY' are thus obtained. Due to the phase-coding of different strengths as a result of the different time intervals relative to the excitation, however, these image matrices have a different zoom factor, this being indicated in FIG. 22 by the broken lines in the image matrices BD2' and BDY'.

Real image matrices DB"-DBY" are acquired by magnitude formation from what are initially image matrices BD1'-DBY' that are still complex. Alternatively, a phase correction could also ensue instead of the magnitude formation since what is ultimately involved in this step is to eliminate phase errors.

The image matrices BD1"-DBY" continue to have different zoom factors, that are corrected in the next step by corresponding expansion. Interpolations are thereby implemented for acquiring the picture elements in a grid defined by the image matrix. Finally, the image data are averaged from the y image data matrices BD1'"DBY'", so that an image data matrix BD is obtained. The image thus acquired has a noticeably improved signal-to-noise ratio. Stated more precisely, the signal-to-noise ratio is improved by the square root of the number of averaged measured points. The measuring time is thereby not lengthened compared to the SPI method with the registration of only a single data point.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for acquiring magnetic resonance signals for reconstructing an image from said magnetic resonance signals of an examination subject comprising the steps of:

conducting a measurement sequence by generating at least one excitation pulse in an excitation phase which excites nuclear spins in an examination subject, phase-coding said nuclear spins in a coding phase by generating a phase-coding gradient, and reading out a nuclear magnetic resonance signal from said examination subject in a read-out phase the nuclear magnetic resonance signal being allocated by a preceding phase-coding gradient to a point in a k-space;

entering each nuclear magnetic resonance signal acquired in said read-out phase into a k-space matrix;

repeating said measurement sequence n times with different phase coding for completely scanning the k-space and thereby completely filling the k-space matrix; and implementing said different phase-coding in the respective measurement sequences by generating a time-extended phase-coding gradient, having an amplitude, and maintaining said time-extended phase-coding gradient activated during a group of chronologically contiguous measurement sequences and changing the amplitude of said time-extended phase-coding gradient from measurement sequence-to-measurement sequence.

2. A method as claimed in claim 1 wherein the step in said measurement sequence of exciting nuclear spins comprises generating at least one broadband excitation pulse.

3. A method as claimed in claim 1 wherein the step in said measurement sequence of reading out a nuclear magnetic resonance signal comprises reading out an FID signal as said nuclear magnetic resonance signal.

4. A method as claimed in claim 1 wherein the step of generating said time-extended phase-coding gradient comprises generating a time-extended phase-coding gradient having a linear slope within said chronologically contiguous measurement sequences.

5. A method as claimed in claim 1 wherein said time-extended phase-coding gradient comprises a first phase-coding gradient, and said method comprising the additional steps of generating a second phase-coding gradient of constant magnitude during each group of measurement sequences, said second phase-coding gradient being disposed perpendicularly relative to said first phase-coding gradient, and switching the magnitude of said second phase-coding gradient between the groups of measurement sequences for completely sampling a two-dimensional k-space.

6. A method as claimed in claim 5 comprising the additional steps of generating third phase-coding gradient of constant magnitude during each group of measurement sequences, said third phase-coding gradient residing perpendicularly relative to said first and second phase-coding gradients, and switching said second and third phase-coding gradients between the groups of measurement sequences for completely sampling a three-dimensional k-space.

7. A method as claimed in claim 1 wherein said k-space matrix comprises a plurality of rows, and comprising the additional step of filling a complete row of the k-space matrix during each said group of measurement sequences.

8. A method as claimed in claim 1 wherein the step of reading-out said nuclear magnetic resonance signals comprises reading out said nuclear magnetic resonance signals in each read-out phase in y fixed time intervals relative to the excitation of said nuclear spins and entering all nuclear magnetic resonance signals read-out during a time interval into a separate k-space matrix and thereby filling y k-space matrices.

9. A method as claimed in claim 8 comprising the additional step of implementing a Fourier transformation of each k-space matrix to obtain y data sets, and combining said y data sets by averaging for producing an image data set, and generating an image of said examination subject from said image data set.

10. A method as claimed in claim 9 comprising the additional step of interpolating said data sets simultaneously with the averaging of said data sets for correcting for different zoom factors.

* * * * *